United States Patent
Kang et al.

(10) Patent No.: US 8,345,484 B2
(45) Date of Patent: *Jan. 1, 2013

(54) NONVOLATILE MEMORY DEVICE AND SYSTEM, AND METHOD OF PROGRAMMING A NONVOLATILE MEMORY DEVICE

(75) Inventors: Dong-Ku Kang, Yongin-si (KR); Hyeong-Jun Kim, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 273 days.

This patent is subject to a terminal disclaimer.

(21) Appl. No.: 12/859,860

(22) Filed: Aug. 20, 2010

(65) Prior Publication Data
US 2011/0044104 A1    Feb. 24, 2011

(30) Foreign Application Priority Data
Aug. 24, 2009  (KR) .................. 10-2009-0078194

(51) Int. Cl.
*G11C 11/34*  (2006.01)
(52) U.S. Cl. ......... 365/185.19; 365/185.03; 365/185.24; 365/185.29
(58) Field of Classification Search .............. 365/185.03
See application file for complete search history.

(56) References Cited

U.S. PATENT DOCUMENTS 7,529,136 B2 * 5/2009 Micheloni et al. ....... 365/185.24
7,684,250 B2 * 3/2010 Chae ....................... 365/185.22

FOREIGN PATENT DOCUMENTS

| JP | 2008525933 A | 7/2008 |
| KR | 20070062956 | 6/2007 |
| KR | 20070101255 A | 10/2007 |
| KR | 100811277 B | 3/2008 |

* cited by examiner

*Primary Examiner* — Hoai V Ho
*Assistant Examiner* — Pablo Huerta
(74) *Attorney, Agent, or Firm* — Volentine & Whitt, PLLC

(57) ABSTRACT

A method of programming a non-volatile memory including N-bit multi-level cell (MLC) memory includes executing an incremental step pulse programming (ISPP) operation on the MLC memory cells, where the ISPP operation includes a programming sequence of first through $N^{th}$ page programming operations, where N is an integer of 2 or more. The programming sequence further includes an erase programming that is executed after the $(N-1)^{th}$ page programming operation and before the $N^{th}$ page programming operation, where the erase page programming increases a threshold voltage distribution of erase cells among the MLC memory cells.

20 Claims, 15 Drawing Sheets

NONVOLATILE MEMORY DEVICE AND SYSTEM, AND METHOD OF PROGRAMMING A NONVOLATILE MEMORY DEVICE

CROSS-REFERENCE TO RELATED APPLICATION(S)

A claim of priority is made to Korean Patent Application No. 10-2009-0078194, filed on Aug. 24, 2009, in the Korean Intellectual Property Office, the disclosure of which is incorporated herein in its entirety by reference.

BACKGROUND

The inventive concepts described herein relate to nonvolatile memory devices and to programming methods performed in the same, and more particularly, to nonvolatile flash memory devices including multi-level cell (MLC) memory cells and to programming methods performed in the same.

FIG. 1 schematically illustrates a memory cell array in which a plurality of nonvolatile memory cells MC <1:9> are coupled at respective intersections of word lines WL <m+1: m−1> and bit lines BL <n+1:n−1>. A multi-level cell (MLC) memory device is characterized by to programming of two (2) or more bits of stored data in each single memory cell. In the case of an N-bit MLC flash memory device (where N is a positive integer), this is accomplished by setting the threshold voltage (e.g., through Fowler-Nordheim tunneling) of each memory cell MC to within one of $2^N$ threshold distributions.

FIG. 2 is a schematic diagram which illustrates an example of programming of a 3-bit MLC flash memory device. Generally, programming of an N-bit MLC memory cell includes a sequence of N programming steps, i.e., one programming step for each bit of the MLC memory cell. Thus, in the case of the 3-bit MLC programming of FIG. 2, a sequence of three (3) programming steps are executed, namely, an least significant bit (LSB) programming, a central significant bit (CSB) programming, and a most significant bit (MSB) programming.

Flash memory devices are partially characterized by being erased before written. This is shown at the top of FIG. 2 in which the initial programmed state of an MLC memory cell is an erase stated E having the lowest threshold voltage (Vth) distribution. In a first LSB programming step, the threshold voltage (Vth) of the MLC memory cell is set to one of the erased state E or a programmed state LP. In a second CSB programming step, the threshold voltage (Vth) of the MLC memory cell is set to one of the erase stated E or a programmed state CP1 (from erased state E), or to one of a programmed state CP2 or CP3 (from programmed state LP). In a third MSB programming step, the threshold voltage (Vth) is set to one of the erased state E or programmed state P1 (from erased state E), or to one of a programmed state P2 or P3 (from programmed state CP1), or to one of a programmed state P4 or P5 (from programmed state CP2), or to one of a programmed state P6 or P7 (from programmed state CP3).

According to an MLC programming method of storing 2-bit data in each cell, each memory cell has one of these states: '11', '10', '01', and '00'. A memory cell with the state of '11' is an erased cell and has the lowest threshold voltage. A memory cell with one of the states '10', '01', and '00' is a programmed cell and has a higher threshold voltage than the cell with the state of '11'. On the other hand, according to an MLC programming method of storing 3-bit data in each cell, each memory cell has one of these states: '111', '110', '101', '100', '011', '010', '001', and '000'. A memory cell with the state of '111' is an erased cell and has the lowest threshold voltage. Memory cells in the other states are programmed cells, and have higher threshold voltages than the cell with the state of '111'.

Generally, each bit of the MLC memory cells has a separate page address. For example, in a 2-bit MLC memory cell, the stored LSB bits of the cells of a word line constitute a first page of data, and the stored MSB bits of the cells of the word line constitute a second page of data. Thus, the N-bit MLC memory cells (where N is two or more) connected to a given word line store N pages of data. In a programming operation, data is programmed in a page-by-page sequence from the LSB to the MSB, i.e., in the order of a first page, a second page, . . . , an $(N-1)^{th}$ page, and an $N^{th}$ page.

MLC memory devices have been developed in response to the demand for higher integration. However, as is apparent from FIG. 2, the gaps between threshold voltage distributions of the MLC memory cells is reduced as the number of bits (N) increases, which can have a negative impact on read margins. In addition, memory chips are being physically integrated at ever higher densities, which can create problems resulting from a coupling effect between memory cells during programming. For example, referring to the memory cell array of FIG. 1, the programming of memory cell MC5 can alter the threshold voltage distributions of neighboring memory cells MC2 and/or MC8. This also can negatively impact read margins.

SUMMARY

According to an aspect of the inventive concepts, a method of programming a non-volatile memory including N-bit multi-level cell (MLC) memory cells is provided. The method includes executing an incremental step pulse programming (ISPP) operation on the MLC memory cells, where the ISPP operation includes a programming sequence of first through $N^{th}$ page programming operations, where N is an integer of 2 or more. The programming sequence further includes an erase programming that is executed after the $(N-1)^{th}$ page programming operation and before the $N^{th}$ page programming operation, where the erase page programming increases a threshold voltage distribution of erase cells among the MLC memory cells.

According to another aspect of the inventive concepts, a non-volatile memory includes an array of multi-level cell (MLC) memory cells, and a write circuit configured to execute an incremental step pulse programming (ISPP) operation on the MLC memory cells, where the ISPP operation includes a programming sequence of least significant bit (LSB) page programming, at least one center significant bit (CSB) page programming, and a most-significant bit (MSB) page programming. The programming sequence executed by the write circuit further includes an erase programming that is executed after the at least one CSB page programming and before the MSB page programming, where the erase programming increases a threshold voltage distribution of erase cells among the MLC memory cells.

According to another aspect of the inventive concepts, a memory system is provided which includes a non-volatile memory device including an array of multi-level cell (MLC) memory cells connected to a plurality of word lines and bit lines, and a memory controller including a host interface and operatively connected to the non-volatile memory device. The non-volatile memory device includes a write circuit configured to execute an incremental step pulse programming (ISPP) operation on the MLC memory cells connected to each word line, wherein the ISPP operation includes a programming sequence of least significant bit (LSB) page programming, at least one center significant bit (CSB) page programming, and most-significant bit (MSB) page programming. The programming sequence executed by the write circuit further includes an erase programming that is executed after the at least one CSB page programming and before the MSB page programming, where the erase programming increases a threshold voltage distribution of erase cells among the MLC memory cells.

BRIEF DESCRIPTION OF THE DRAWINGS

The above and other aspects of the inventive concepts will become readily apparent from the detailed description that follows, with reference to the accompanying drawings, in which.

DETAILED DESCRIPTION OF THE EMBODIMENTS

Various example embodiments of the inventive concepts are described below with reference to the accompanying drawings, where like reference numbers are used to denote like or similar elements. The inventive concepts may, however, be embodied in many different forms and are not to be construed as limited to the embodiments set forth herein.

To facilitate understanding, a number of non-limiting descriptive terms may be utilized which are not intended to define the scope of the inventive concepts. For example, although the terms "first", "second", etc. may be used herein to describe various elements, these elements should not be limited by these terms. These terms are simply used to distinguish one element from another. For example, a first element could be termed a second element, and, similarly, a second element could be termed a first element, without departing from or limiting the scope of the inventive concepts.

Likewise, the words "over", "under", "above", "below", etc. are relative terms which are not intended to limit the inventive concepts to a particular device orientation. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
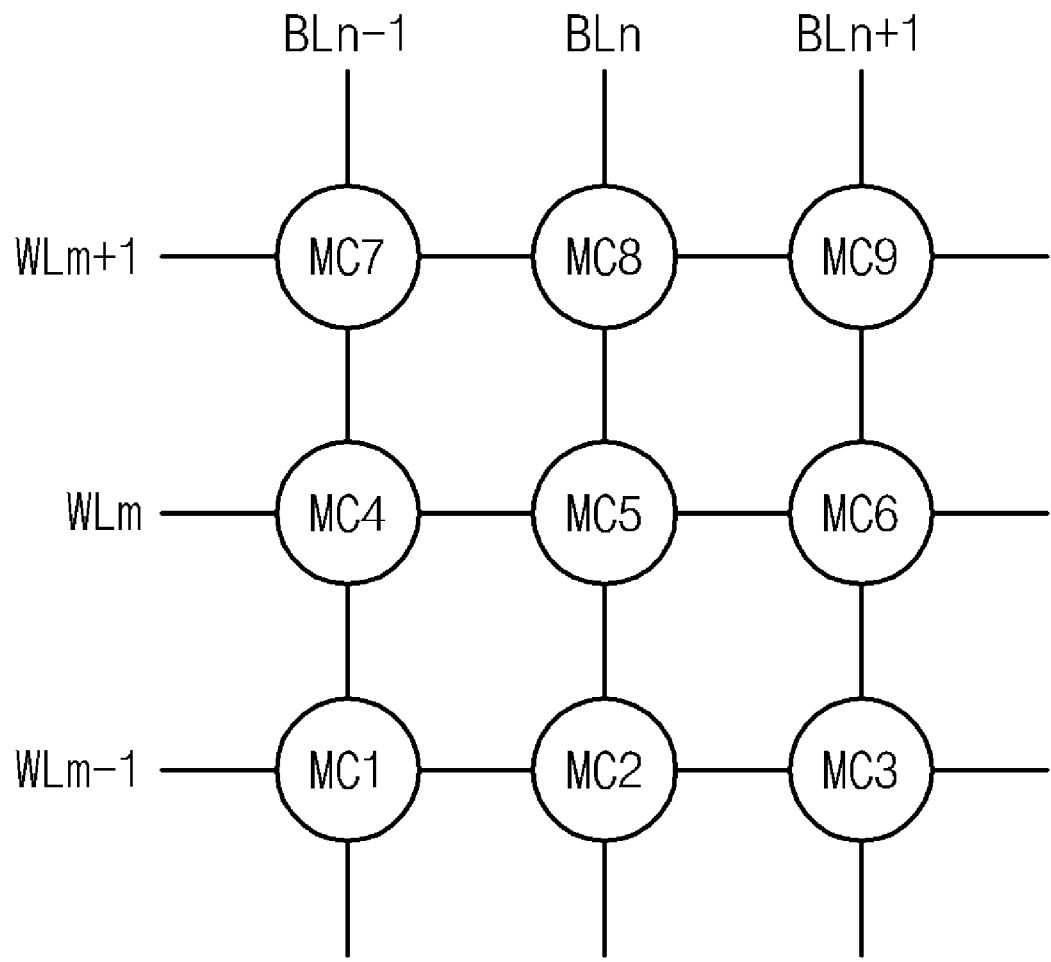
FIG. 1 is a schematic diagram of a nonvolatile memory array.
Figure 2:
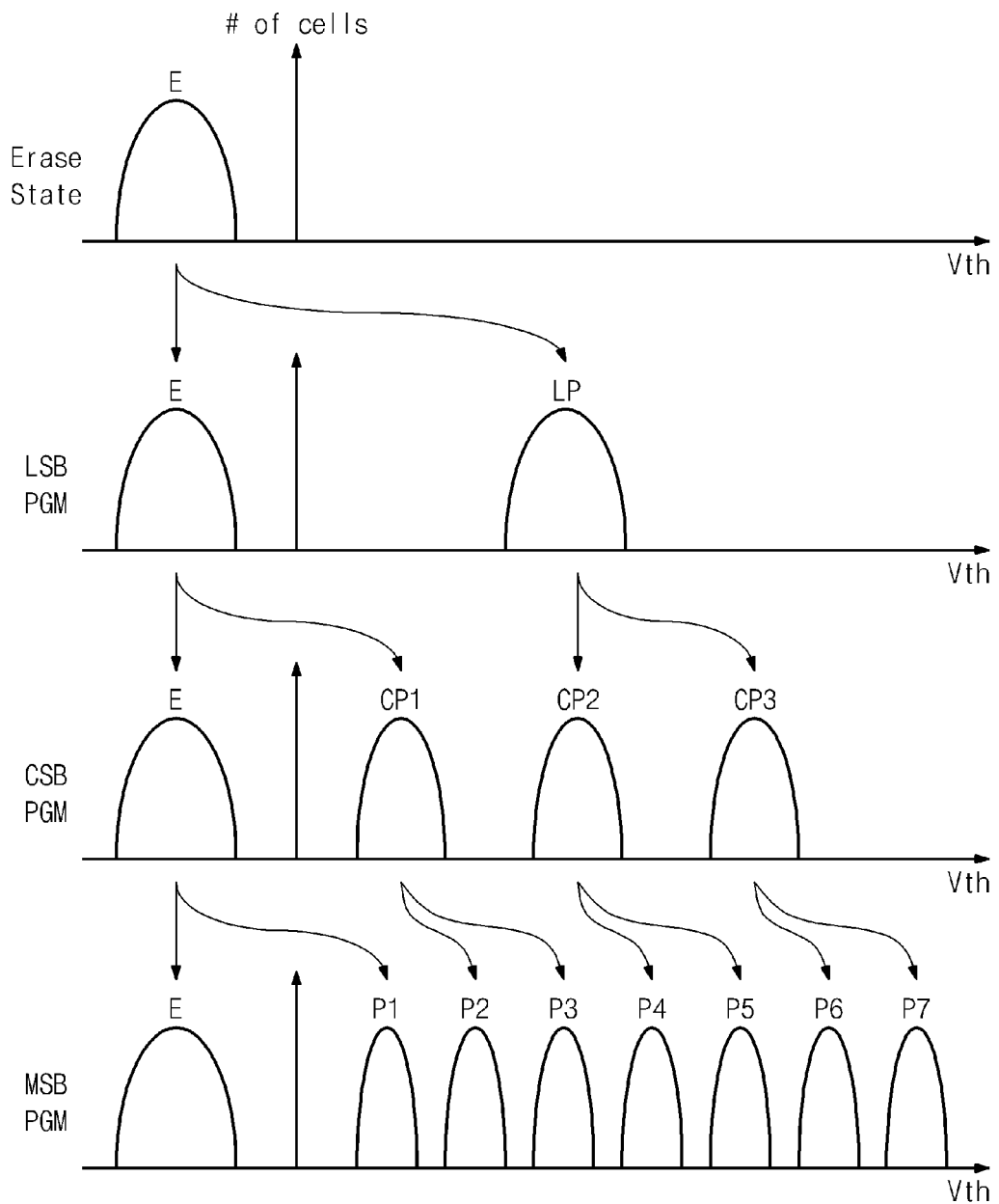
FIG. 2 is a threshold voltage distribution diagram for use in describing multi-bit programming of a multilevel cell (MLC) flash memory device.
Figure 3:
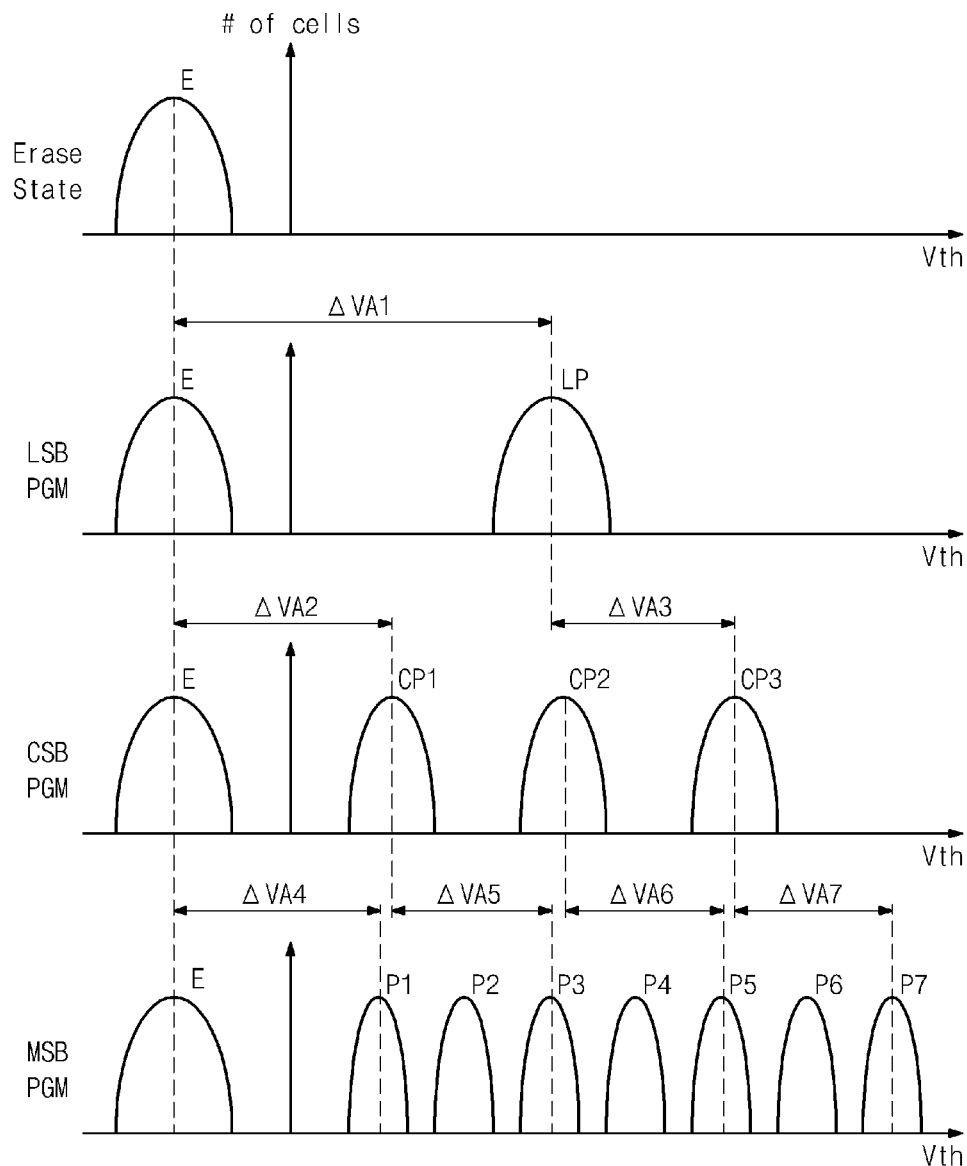
FIG. 3 is a threshold voltage distribution diagram for use in describing a coupling effect between memory cells of a multilevel cell (MLC) flash memory device.

A coupling effect during MLC programming will first be described with reference to the threshold voltage distribution diagram of FIG. 3. Referring to this figure, in order to change a flash memory cell from state E to state LP during least significant bit (LSB) programming, a threshold voltage shift $\Delta VA1$ must be realized.

During central significant bit (CSB) programming, a threshold voltage shift $\Delta VA2$ is needed to change the flash memory cell state from state E to state CP1, and a threshold voltage shift $\Delta VA3$ is needed to change the flash memory cell state from state LP to state CP3. Here, $\Delta VA2 > \Delta VA3$.

During most significant bit (MSB) programming, a threshold voltage shift $\Delta VA4$ is needed to change the flash memory cell state from state E to state P1, a threshold voltage shift $\Delta VA5$ is needed to change the flash memory cell state from state CP1 to state P3, a threshold voltage shift $\Delta VA6$ is needed to change the flash memory cell state from state CP2 to state P5, and a threshold voltage shift $\Delta VA7$ is needed to change the flash memory cell state from state CP3 to state P7. Here, $\Delta VA4 > \Delta VA5 > \Delta VA6 > \Delta VA7$.

Generally, the coupling effect on adjacent memory cells causes the threshold voltage distributions of the adjacent memory cells to widen, thus reducing read margins. Further, the coupling effect is increased in proportion to the magnitude of the shift in threshold voltage Vt ($\Delta VA<1:7>$). However, by adopting a technique known as Incremental Step Pulse Programming (ISPP), the coupling effect on programmed states (non-erased states) can be substantially eliminated or negated. In the example of a NAND type flash memory, a data programming operation consists of repeatedly performing a programming operation a number of times which applies a high programming word line voltage to a selected word line and a reference bit line voltage to the bit line, and performs data programming (follow by read verification) according the difference in voltage between the programming word line voltage and the reference bit line voltage. By setting the programming word line voltage to a variable voltage which is incremented along with an increase of the number of times of programming, the data is programmed so that the difference in the programming voltage is incremented along with an increase of the number of times of programming. This technique is referred to as an Incremental Step Pulse Programming (ISSP) method. The ISSP method is effective in increasing the low-end of a threshold voltage distribution which has been previously widened by the coupling effect, thus decreasing the width of the threshold voltage distribution. For example, referring to FIG. 3, it can be seen that the low-end of the threshold voltage distribution of state CP2 is increased relative to that of state LP, and the width of the threshold voltage distribution of state CP2 is decreased relative to that of state LP.

However, the ISSP technique is not applied to erased cells and thus is not effective with respect to countering the coupling effect on erased (E) cells. Instead, the couple effect (threshold voltage distribution spread) exerted on erased cells is accumulated each time the adjacent cells are programmed. As a result, the erased (E) cells are a major contributor to and are most affected by the coupling effect.

Figure 4:
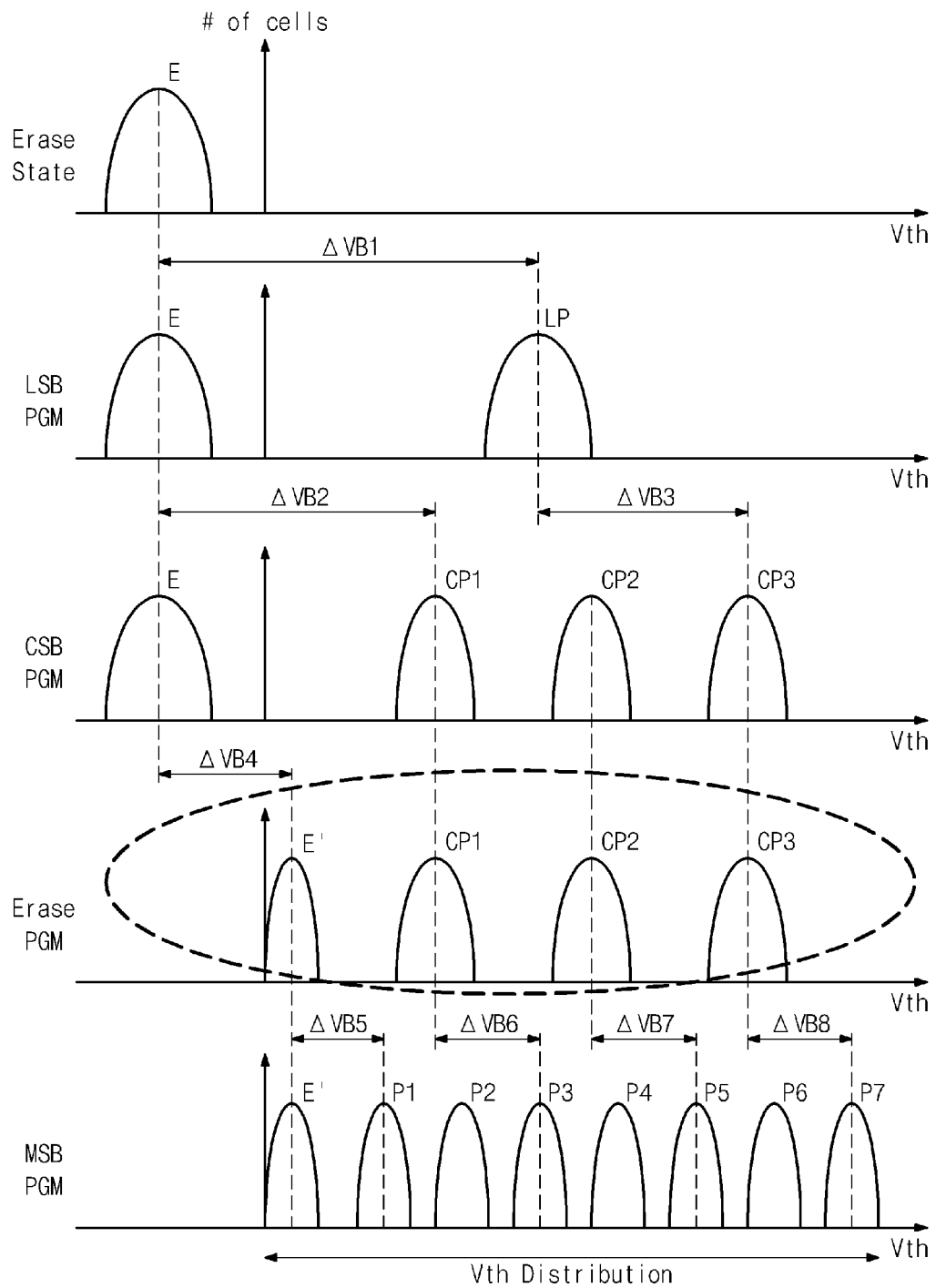
FIG. 4 is a threshold voltage distribution diagram for use in describing programming of a multilevel cell (MLC) flash memory device according to an embodiment of the inventive concepts.

FIG. 4 illustrates examples of threshold voltage Vt distributions during programming of N-bit memory cells connected to a word line according to an embodiment of the inventive concepts. In this particular example, N=3. However, the inventive concepts are not limited thereto, and instead, the inventive concepts are applicable to MLC memory cells in which N is 2 or more.

The programming of the illustrated embodiment is at least partially characterized by inserting a erased (E) cell programming step into an ISSP page programming sequence of a word line. Specifically, the erased (E) cell programming is inserted after programming of a page (N−1) and before programming of a page N.

Referring to FIG. 4, all memory cells of the word line are initially in an erased state E. A first LSB page programming step (LSB PGM) is then executed according to the ISSP technique to program a first page of data in the memory cells of the word line. At this time, a threshold voltage Vt of each memory cell either remains in the erased state E distribution, or is shifted to a programmed state LP distribution. The shift in threshold voltage Vt is ΔVB1.

Next, one or more CSB page programming steps (CSB PGM) is executed to program a second page (or second and third pages, and so on) of data in the memory cells of the word line. At this time, the threshold voltage Vt of each memory cell either remains in the erased state E distribution, or is shifted from the erased state E to the programmed state CP1 by ΔVB2, or is shifted from the programmed state LP to the programmed state CP3 by ΔVB4. Note also that the programmed state CP2 is shifted relative to the programmed state LP as a result of the ISSP programming.

After the CSB page programming (i.e., after the (N−1) page programming), an erase programming (Erase PGM) is executed on the memory cells of the word line that are in the erased state E. Here, at this time, the threshold voltage Vt of each erased state E memory cell is shift by ΔVB4 to an erased state E'. As will be explained below in more detail with respect to the specific example of FIGS. 5A through 8, this has the effect of negating a previously accumulated coupling effect in the erased memory cells of the word line. In addition, when executing a next MSB page programming on the word line, a coupling effect on an adjunct word line is reduced when the erased state E' cells are programmed. Still further, an overall voltage threshold Vt distribution is reduced relative to that of FIG. 3.

After the erase programming, an MSB page programming is executed to program a final page of data in the memory cells of the word line. At this time, the threshold voltage Vt of each memory cell either remains in the shifted erased state E' distribution, or is shifted from the erased state E' to the programmed state P1 by ΔVB5, or is shifted from the programmed state CP1 to the programmed state P3 by ΔVB6, or is shifted from the programmed state CP2 to the programmed state P5 by ΔVB7, or is shifted from the programmed state CP3 to the programmed state P7 by ΔVB8. Note also that the programmed states P2, P4 and P6 are shifted relative to the respective programmed states CP1, CP2 and CP3 as a result of the ISSP programming.

A page programming sequence of a 3-bit MLC flash memory device (i.e., N=3) will now be described in more detail with respect to the example as illustrated in FIGS. 5A through 10. This example follows a programming protocol that dictates that an $n^{th}$ page programming of each word line can be executed after an $(n-1)^{th}$ page programming of at least one neighboring word line has been executed, where n is 1 to N.

Figure 5A:
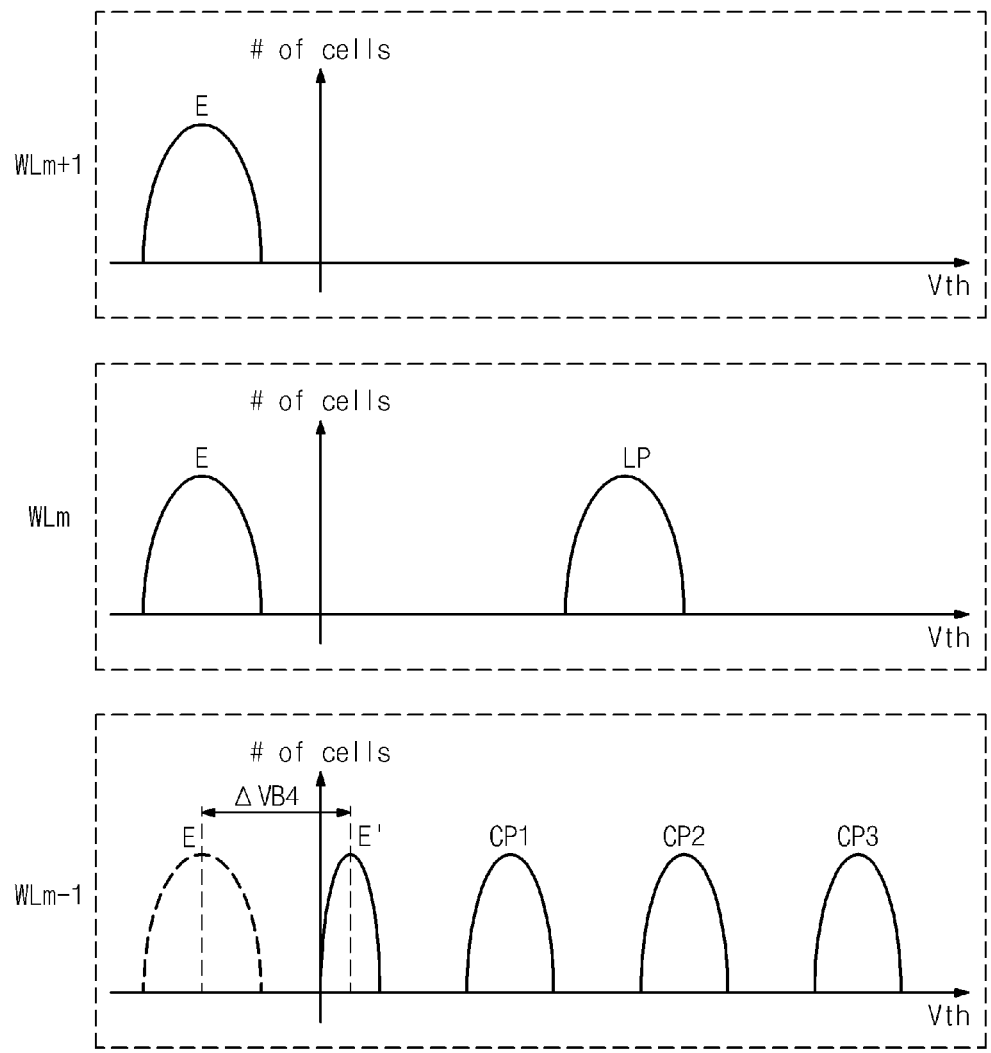
FIGS. 5A, 6A and 7A are threshold voltage distribution diagrams for use in describing a sequence of programming steps of a multilevel cell (MLC) flash memory device according to an embodiment of the inventive concepts.
Figure 5B:
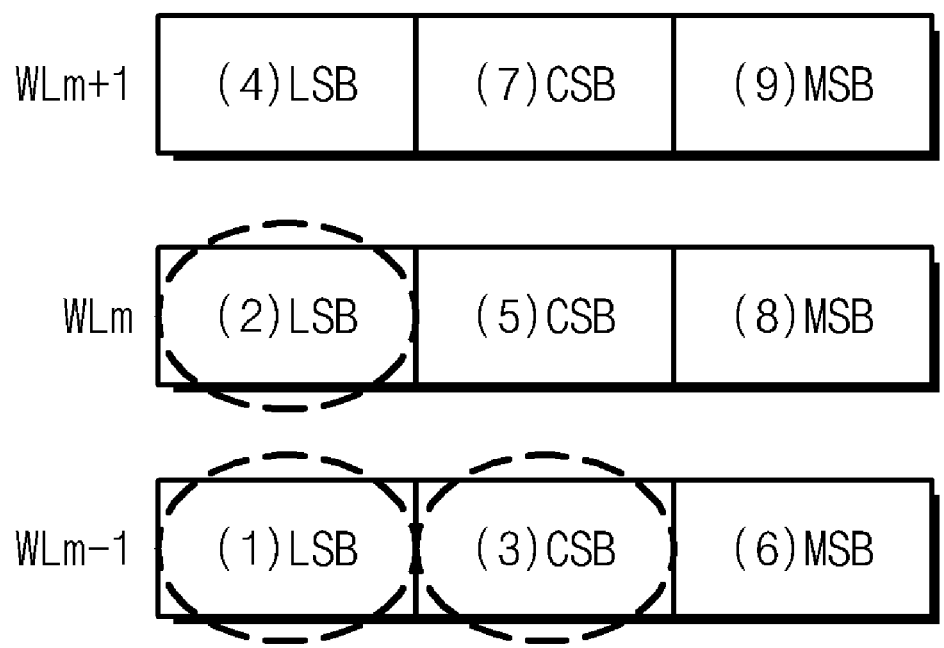
FIGS. 5B, 6B, 7B and 8 are schematic diagrams for use in describing a sequence of programming steps of a multilevel cell (MLC) flash memory device according to an embodiment of the inventive concepts.

FIG. 5A is a diagram depicting threshold voltage (Vt) distributions of adjacent word lines WLm−1, WLm and WLm+1 after execution of the initial three (3) programming steps of the page programming sequence, followed by a first erase programming step of the page programming sequence. FIG. 5B is a diagram showing the order in which the page programming steps are carried out, with the numbers in parenthesis denoting the page programming step number of the sequence.

Referring to FIG. 5B, a first page programming step in the sequence is LSB page programming of the word line WLm−1. As shown in previously described FIG. 4, a resultant shift in threshold voltage Vt is ΔVB1, which exerts a coupling effect (CE) on cells of the adjacent word line WLm.

Next, the second page programming step in the sequence is LSB page programming of the word line WLm. Again, the resultant shift in threshold voltage is ΔVB1. Here, in accordance with the ISPP programming sequence, the coupling effect generated by the first step is negated for the programmed cells of the word line WLm, but not for erased cells (E) of word line WLm. Further, the shift ΔVB1 exerts a coupling effect on memory cells of word lines WLm−1 and WLm+1.

The third page programming step, in accordance with the ISPP programming method, is CSB page programming of the word line WLm−1. Here, by the ISPP programming, the coupling effect generated by the second step is negated for the programmed cells of the word line WLm−1, but not for erased cells (E) of word line WLm−1. Further, a shift ΔVB2 (see FIG. 4) exerts a coupling effect on memory cells of word lines WLm.

At this time, according to this embodiment of the inventive concepts, an erase programming is executed using the ISPP technique for the erased (E) memory cells of word line WLm−1.

The erase programming of word line WLm−1 is represented in FIG. 5A by a shift of ΔVB4 in the erased state of word line WLm−1 from erased state E to erased state E'. By executing the ISPP technique to shift the erased cells from erased state E to erased state E', the previously accumulated coupling effect on the erased cells of the word line WLm−1 is negated. In the example of this embodiment, the erased state distribution is shifted by $\Delta VB4$, and thus the coupling effect exerted on word line WLm is $\Delta VB4$.

Prior to execution of the first erase programming, the previously accumulated coupling effect on the erased (E) cells of the word line WLm−1 include the $\Delta VB1$ coupling effect during LSB page programming of the word line WLm. Note also that the accumulated coupling effect of the erased cells (E) of the word line WLm−1 would additionally include coupling that occurred during LSB and CSB programming of a word line WLm−2 (not shown). By executing the ISPP erase programming on the erased cells (E) of the word line WLm−1 before MSB page programming of the word line WLm−1, this accumulated coupling effect is negated for the erased cells (E) of the word line WLm−1.

Figure 6A:
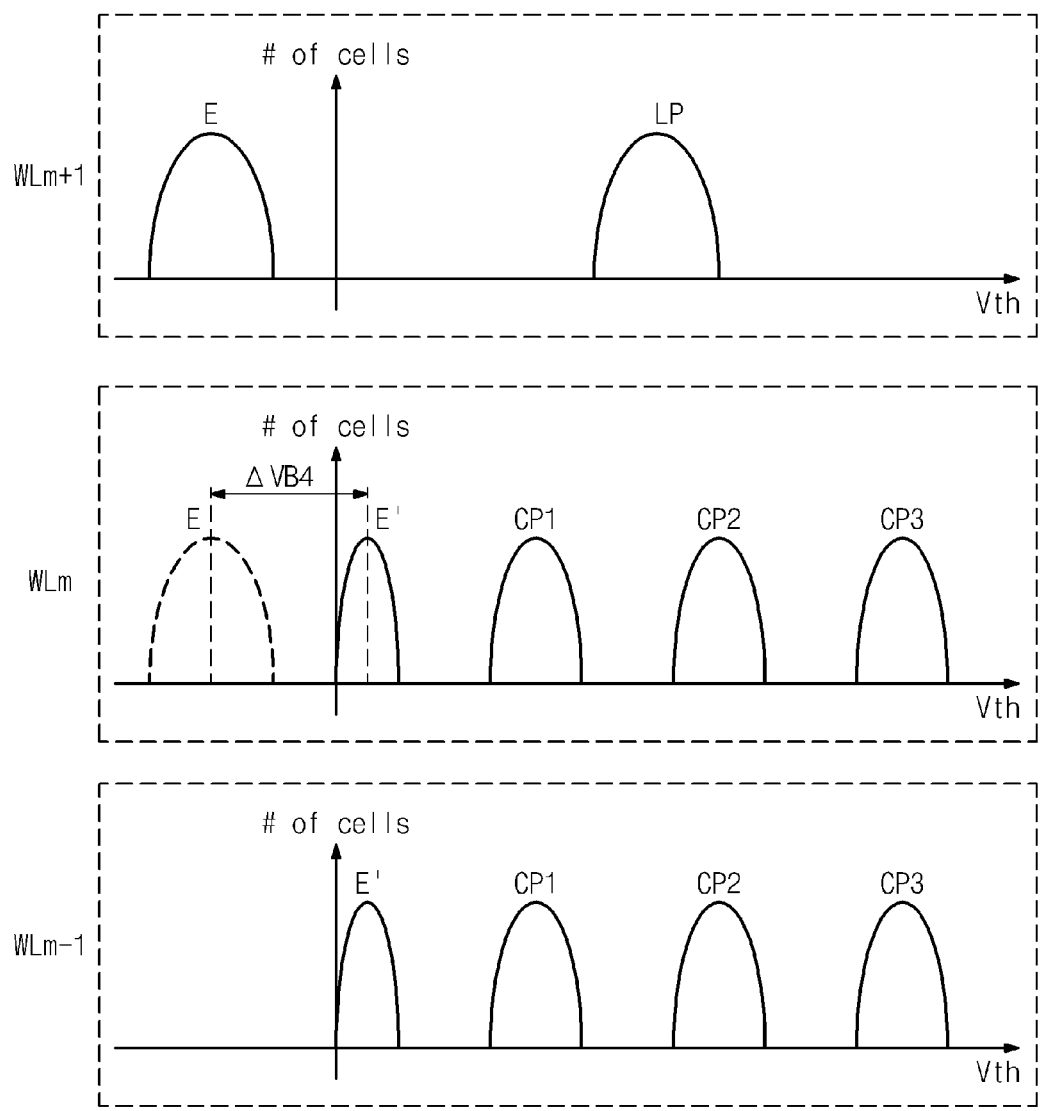
Figure 6B:
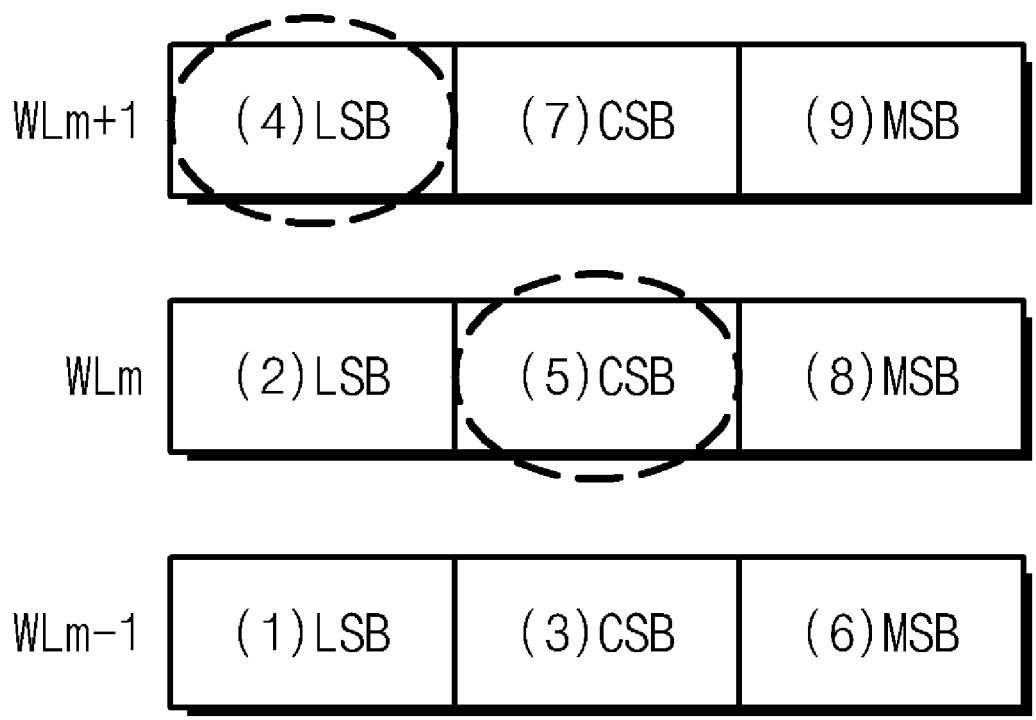

FIG. 6A is a diagram depicting threshold voltage (Vt) distributions of the adjacent word lines WLm−1, WLm and WLm+1 after execution of the next two (2) page programming steps of the page programming sequence, followed by a second erase programming step of the page programming sequence. FIG. 6B is a diagram showing the order in which the page programming steps are carried out, with the numbers in parenthesis denoting the page programming step number of the sequence.

Referring to FIG. 6B, a fourth page programming step in the sequence is LSB page programming of the word line WLm+1. Here, in accordance with the ISPP programming sequence, the coupling effect generated by previous programming steps is negated for the programmed cells of the word line WLm+1, but not for erased cells (E) of word line WLm+1. As shown in previously described FIG. 4, a resultant shift in threshold voltage Vt is $\Delta VB1$, which exerts a coupling effect (CE) on cells of the adjacent word line WLm.

Next, the fifth page programming step in the sequence is CSB page programming of the word line WLm. Here, in accordance with the ISPP programming sequence, the coupling effect generated by previous page programming steps is negated for the programmed cells of the word line WLm, but not for erased cells (E) of word line WLm. Further, a voltage distribution shift $\Delta VB2$ exerts a coupling effect on memory cells of word lines WLm−1 and WLm+1.

At this time, according to this embodiment of the inventive concepts, a second erase programming is executed using the ISPP technique for the erased (E) memory cells of word line WLm.

The erase programming of word line WLm is represented in FIG. 6A by the shifting of the erased state of word line WLm from erased state E to erased state E'. By executing the ISPP technique to shift the erased cells from erased state E to erased state E', the previously accumulated coupling effect on the erased cells of the word line WLm is negated. That is, prior to execution of the second erase programming, the previously accumulated coupling effect on the erased (E) cells of the word line WLm includes the $\Delta VB1$ coupling effect during LSB page programming of the word line WLm−1, the $\Delta VB2$ coupling effect during CSB page programming of the word line WLm−1, the $\Delta VB1$ coupling effect during LSB page programming of the word line WLm+1, and the $\Delta VB4$ coupling effect during erase programming of the word line WLm−1. By executing the ISPP erase programming on the erased cells (E) of the word line WLm before MSB page programming of the word line WLm, this accumulated coupling effect is negated for the erased cells (E) of the word line WLm.

Figure 7A:
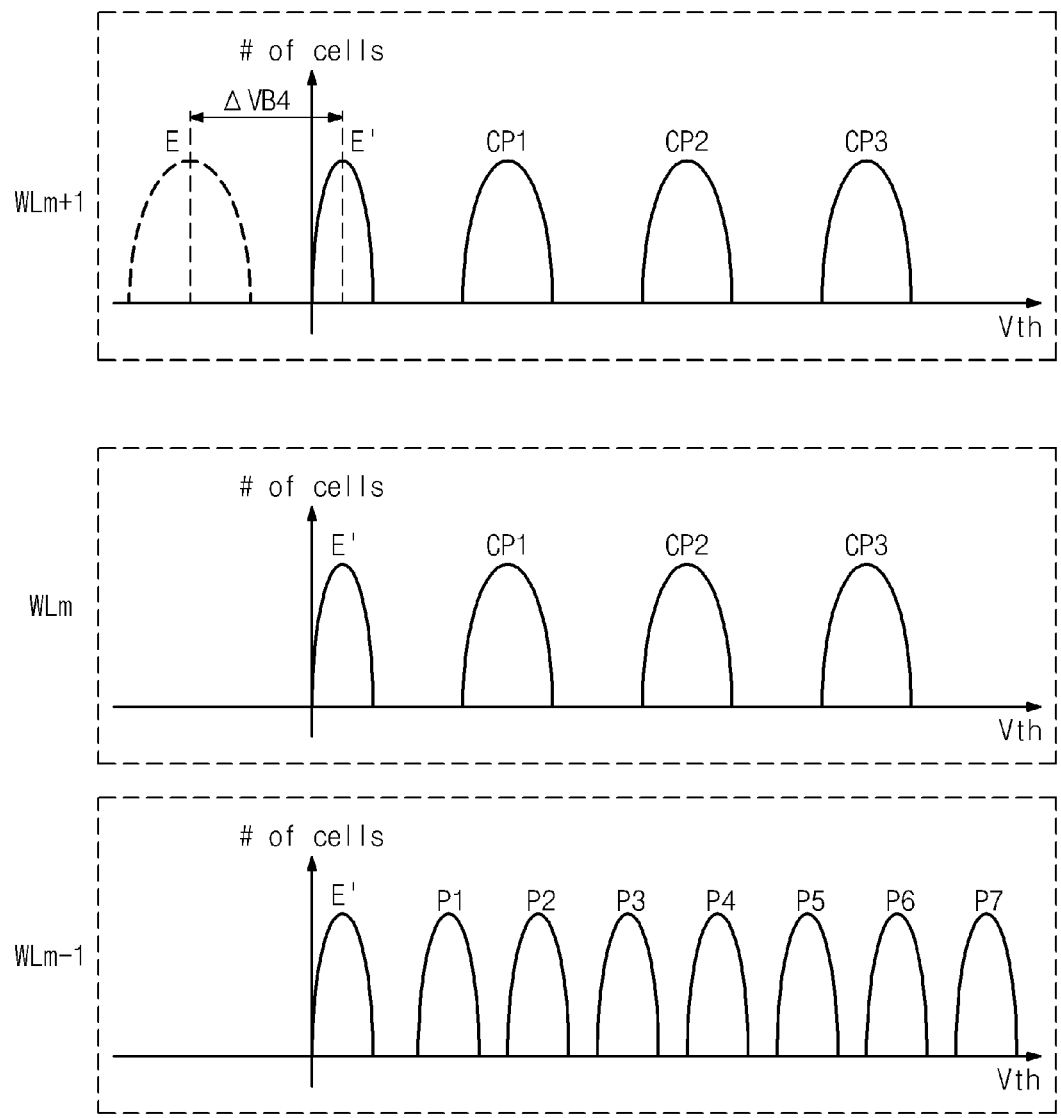
Figure 7B:
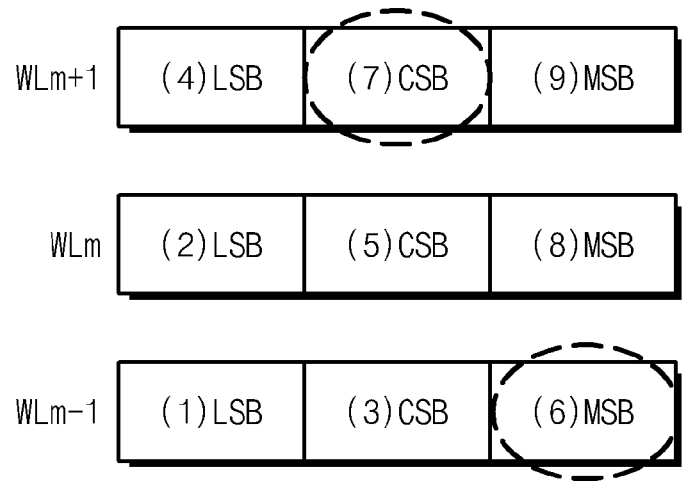

FIG. 7A is a diagram depicting threshold voltage (Vt) distributions of the adjacent word lines WLm−1, WLm and WLm+1 after execution of the next two (2) page programming steps of the page programming sequence, followed by a third erase programming step of the page programming sequence. FIG. 7B is a diagram showing the order in which the page programming steps are carried out, with the numbers in parenthesis denoting the page programming step number of the sequence.

Referring to FIG. 7B, a sixth page programming step in the sequence is MSB page programming of the word line WLm−1. Here, a resultant shift in threshold voltage Vt is $\Delta VB5$ (for the erased state E' cells), which exerts a coupling effect (CE) on cells of the adjacent word line WLm.

Note here that the previous (first) erase programming of the word line WLm−1 substantially reduces the coupling effect on the adjacent word line WLm. That is, referring to FIG. 3, it can be seen that programming of the erased cells exerts a coupling effect of $\Delta VA4$ on the adjacent cells of the word line WLm. In contrast, referring to FIG. 4, by executing the erase operation of the word line WLm−1 prior to MSB programming, the coupling effect on the word line WLm is reduced to $\Delta VB5$ during MSB programming of the word line WLm−1.

In other words, a reduction in coupling effect of $\Delta VB4 = \Delta VA4 - \Delta VB5$ is realized during MSB programming of the word line WLm−1.

Next, the seventh page programming step in the sequence is CSB page programming of the word line WLm+1. Here, in accordance with the ISPP programming sequence, the coupling effect generated by previous page programming steps is negated for the programmed cells of the word line WLm+1, but not for erased cells (E) of word line WLm+1. Further, a voltage distribution shift $\Delta VB2$ exerts a coupling effect on memory cells of word lines WLm.

At this time, according to this embodiment of the inventive concepts, a third erase programming is executed using the ISPP technique for the erased (E) memory cells of word line WLm+1.

The erase programming of word line WLm+1 is represented in FIG. 7A by a $\Delta VB4$ shift of the erased state of word line WLm from erased state E to erased state E'. By executing the ISPP technique to shift the erased cells from erased state E to erased state E', the previously accumulated coupling effect on the erased cells of the word line WLm+1 is negated. That is, prior to execution of the third erase programming, the previously accumulated coupling effect on the erased (E) cells of the word line WLm+1 includes the $\Delta VB1$ coupling effect during LSB page programming of the word line WLm, the $\Delta VB2$ coupling effect during CSB page programming of the word line WLm, and the $\Delta VB4$ coupling effect during erase programming of the word line WLm. By executing the ISPP erase programming on the erased cells (E) of the word line WLm+1 before MSB page programming of the word line WLm+1, this accumulated coupling effect is negated for the erased cells (E) of the word line WLm+1.

Figure 8:
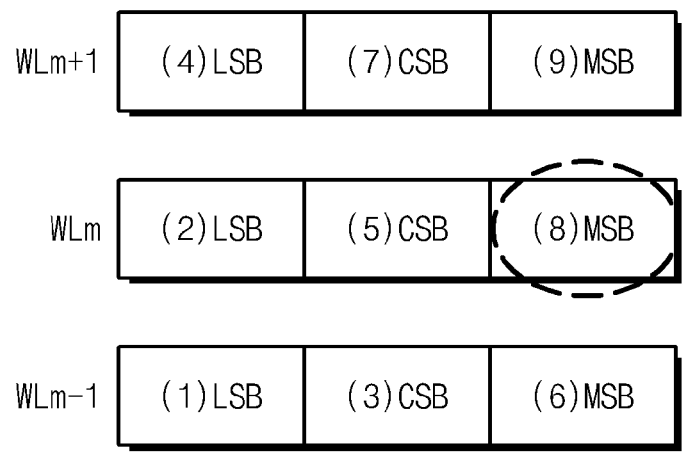

Referring to FIG. 8, which is another diagram showing the order in which the page programming steps are carried out, the seventh programming step in the sequence is MSB page programming of the word line WLm. Again, the previous (second) erase programming of the word line WLm substantially reduces the coupling effect on the adjacent word lines WLm−1 and WLm+1 for the same reasons as discussed above in connection with word line WLm−1. That is, a reduction in coupling effect of $\Delta VB4 = \Delta VA4 - \Delta VB5$ is realized during MSB programming of the word line WLm.

The remainder of the programming sequence, including MSB programming of the word line WLm+1, will be readily apparent to those skilled in the art. Further, those skilled in the art will understand that the example presents only three word lines WL for ease of explanation, that an actual memory device may have hundreds of word lines, and that the specific sequence may be altered by the additional word lines.

As described above, the programming method of the example embodiment allows for a coupling effect exerted on erased cells to be negated prior to MSB programming, and further reduces a coupling effect on adjacent word lines during MSB programming. Further, a threshold voltage Vth distribution after MSB programming is complete may be reduced.

Figure 9:
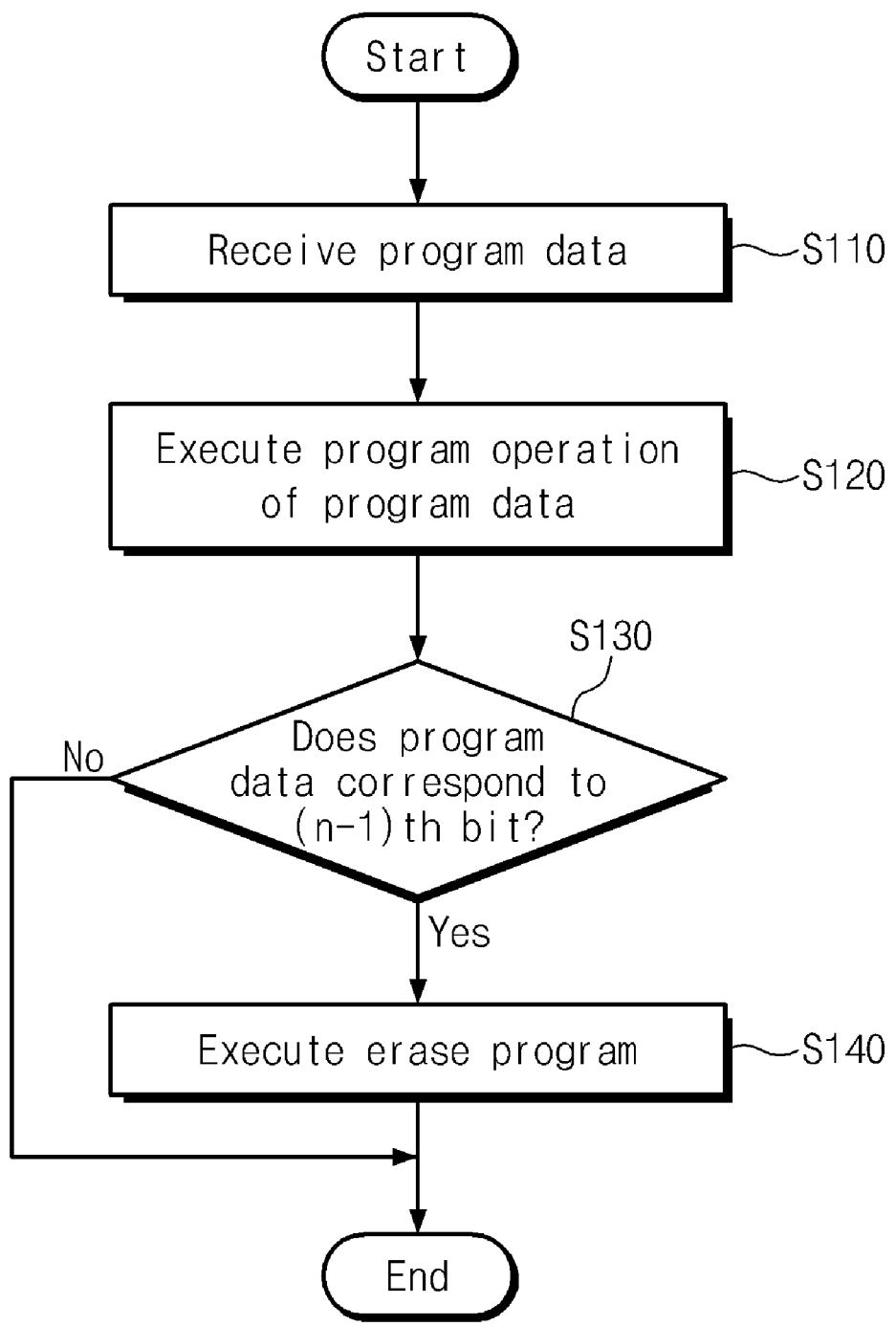
FIG. 9 is a flowchart for or use in describing programming of a multilevel cell (MLC) flash memory device according to an embodiment of the inventive concepts.

FIG. 9 is a flow chart for use in describing a method of programming an N-bit MLC flash memory according to an embodiment of the inventive concepts.

Referring to FIG. 9, a page of program data is received (S110), and then the page data is programmed into a word line utilizing ISPP programming (S120). Next, a determination is made as to whether the most recently programmed page is directed to the (N−1)th page of data to be stored in the bit line (S130). For example, in the case of 3-bit memory cells, a determination is made as to whether program data is for the second page, and in the case of 4-bit memory cells, a determination is made as to whether program data is for the third page, and so on.

The method of executing the determination process S130 is not limited. For example, the determination can be made based on the page address of the program data. Alternately, reference can be made to flag cells indicative of how many bits have been programmed into memory cells of a given word line. As another alternative, a table may be utilized to store the number of bits programmed into each cell.

In the case where the most recently programmed page is not directed to the (N−1)th page of data to be stored in the bit line (No at S130), the process ends and/or returns to S110 to receive the next page of program data.

In the case where the most recently programmed page is directed to the (N−1)th page of data to be stored in the bit line (Yes at S130), an erase programming is executed (S140) for memory cells in the erased state of the word line. The erase programming is described in detail above.

Figure 10:
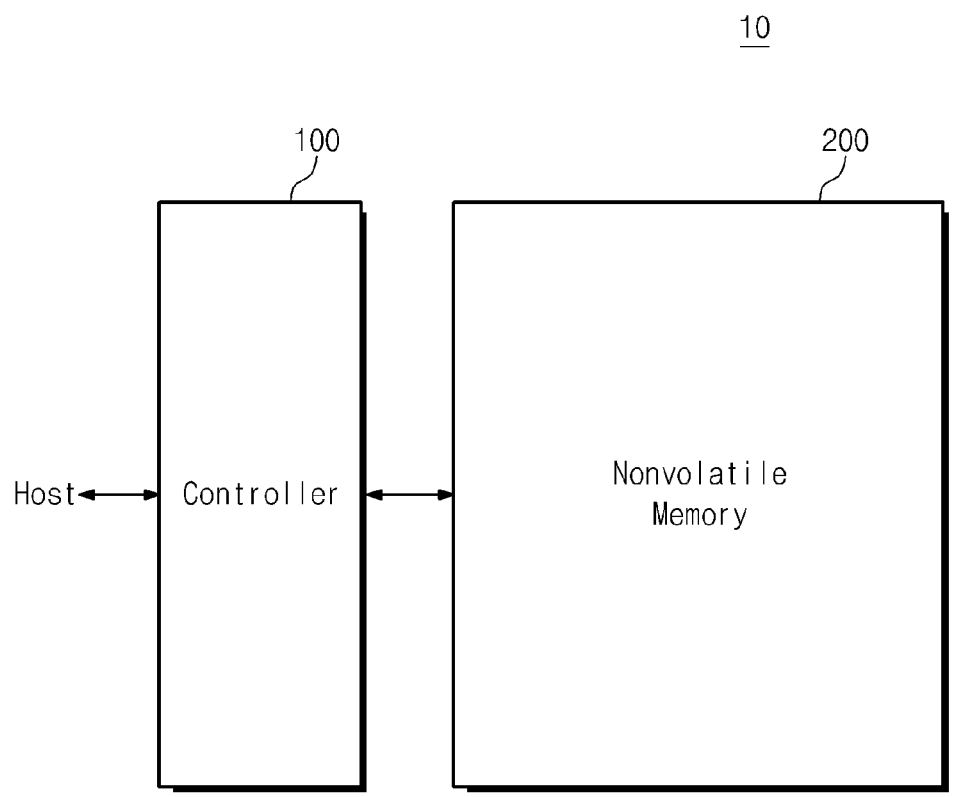
FIG. 10 is a block diagram of a memory system according to an embodiment of the inventive concepts.
Figure 11:
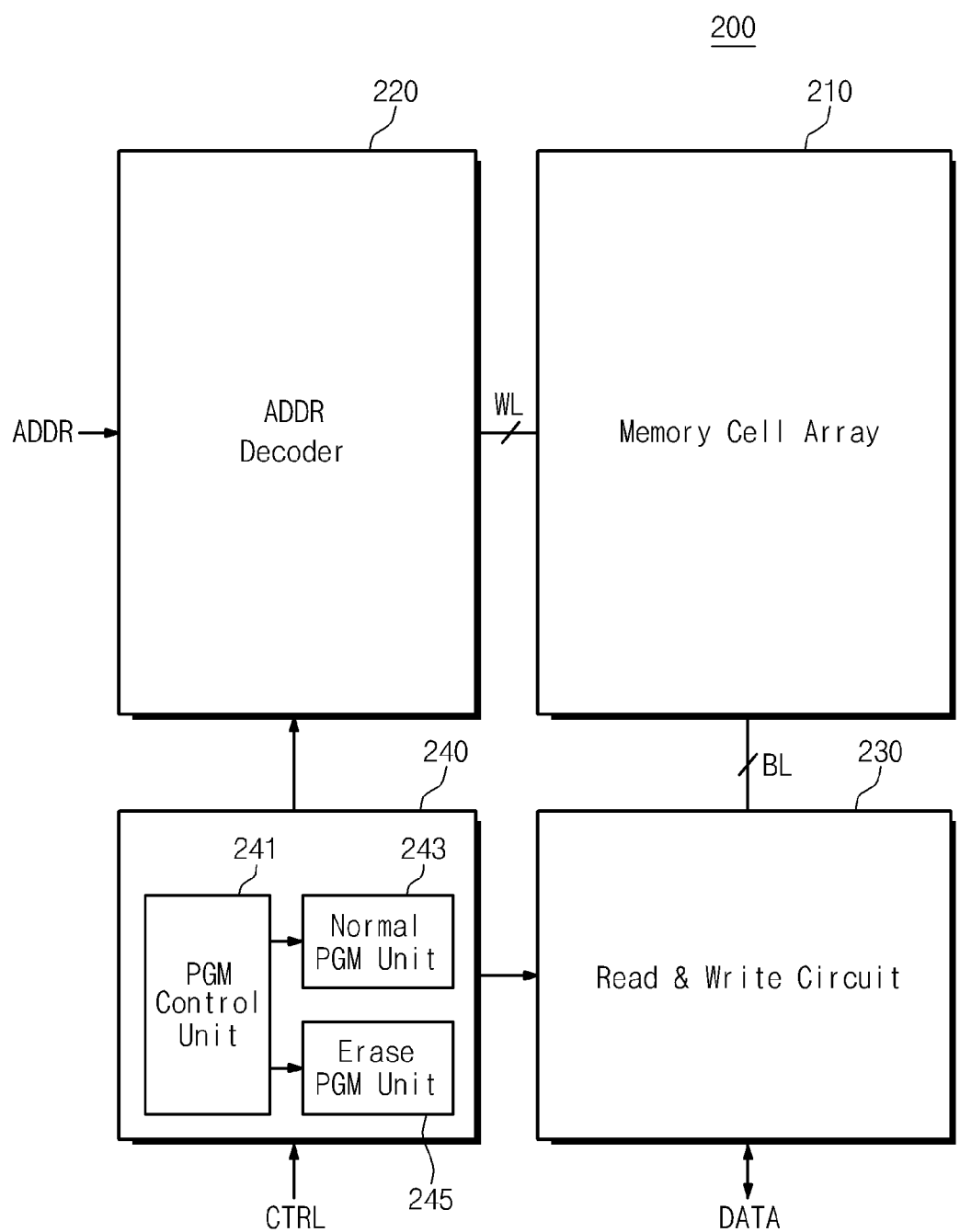
FIG. 11 is a block diagram of a nonvolatile memory shown in FIG. 12 according to an embodiment of the inventive concepts.

FIG. 10 is a block diagram illustrating a memory system 10 in accordance with an embodiment of the inventive concepts, and FIG. 11 is a block diagram of a nonvolatile memory 200 of the memory system 10 in accordance with an embodiment of the inventive concepts. The memory system 10 may, for example, be a solid state drive (SSD), but the inventive concepts are not limited thereto. Other examples of the memory system 10 include a multimedia card (MMC) card, a Secure Digital (SD) card, a micro SD card, a memory stick, an ID card, a PCMCIA card, a chip card, a USB card, a smart card, and a Compact Flash (CF) card.

The memory controller 100 communicates with an external device (e.g., a host) through one of various interface protocols, examples of which include a universal serial bus (USB), a multimedia card (MMC) interface, a peripheral component interconnect-express (PCI-E), a serial advanced technology attachment (SATA), a parallel advanced technology attachment (PATA), a small computer system interface (SCSI), an enhanced small disk interface (ESDI), integrated drive electronics (IDE), and the like. The memory controller 100 is responsive to commands from the external device to program write data from the external device into nonvolatile memory 200 and to retrieve read data from the nonvolatile memory 200 for transmission to the external device.

As shown in FIG. 11, the nonvolatile memory 200 of this example includes a nonvolatile memory cell array 210, an address decoder 220, a read & write circuit 230, and a control logic 240. The address decoder is responsive to the control logic 240 to decode a read/write address ADDR to thereby select addressed word lines WL of the nonvolatile memory cell array, and the read & write circuit 230 is responsive to the control logic 240 to apply input data (DATA) to address bit lines BL in a programming mode, and to read data (DATA) from address bit lines BL in a read mode. The control logic 240 controls an overall operation of the nonvolatile memory 200. Further, in this embodiment, the control logic 240 includes a program control (PGM) unit 241, a normal program (PGM) unit 243, and an erase program (PGM) unit 245. In operation, the program control unit 241 controls whether a normal page programming is to be executed, or an erase page programming is to be executed. For example, the program control unit 241 may operate in manner such as that depicted in the flow chart of previously described FIG. 9. The normal program unit 243 executes normal page programming, such as LSB page programming, CSB page programming, and MSB page programming described in connection with the previous embodiments. The erase programming unit executes the erase programming of the previous embodiments, i.e., erase programming is executed after the (N−1) page programming is complete and before the N page programming is initiated. The logic unit 240 may be implemented by digital and/or analog circuits, and/or by software control.

Figure 12:
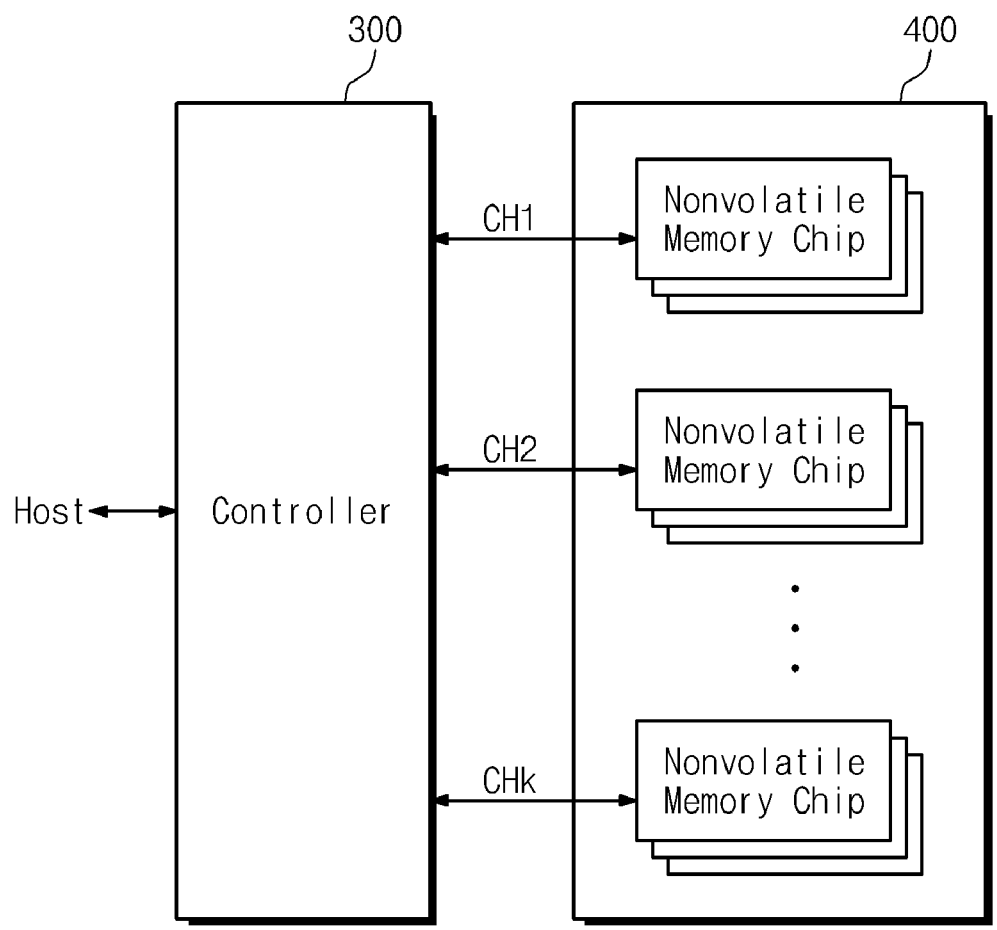
FIG. 12 is a block diagram of a memory system according to another embodiment of the inventive concepts.

FIG. 12 is a block diagram showing another example of a memory system 20. This example is similar to that of FIG. 10, except that the memory controller 300 communicates over a plurality of channels CH1<1:k>with a nonvolatile memory 400 containing a plurality flash memory chips. Each channel CH can be configured to provide communication for a group of flash memory chips, and each flash memory chip may be configured in a manner such as that of FIG. 11. Again, this example may be implemented as an SSD or memory card or the like, but the inventive concepts are not limited thereto.

Figure 13:
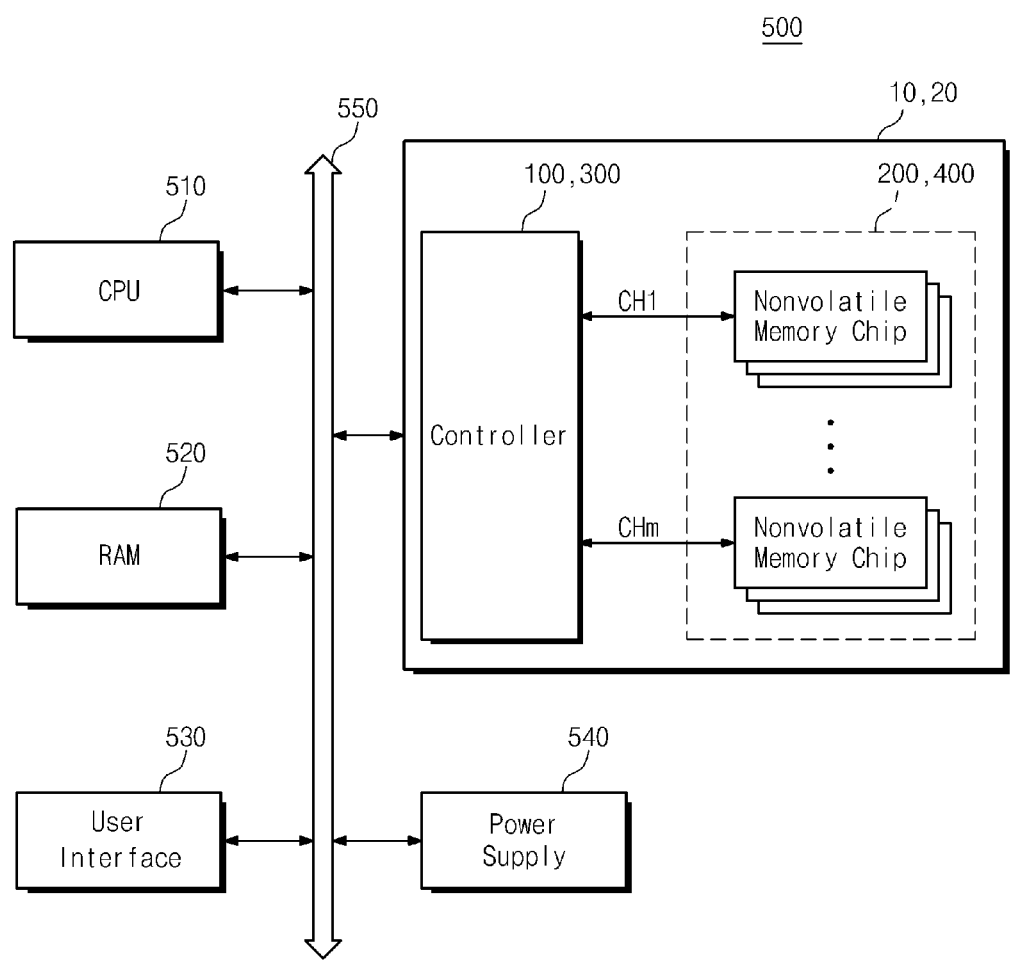
FIG. 13 is a block diagram of a computer system according to an embodiment of the inventive concepts.

FIG. 13 is a block diagram of a computing system 500 in accordance with an embodiment of the inventive concepts. Examples of the computing system 500 include mobile devices, personal computers, digital cameras, camcorders, cell phones, MP3 players, Portable Multimedia Players (PMPs), Personal Digital Assistants (PDAs), and High Definition Televisions (HDTV). The computing system 500 of this example includes a central processing unit (CPU) 510, a user interface 530, a random access memory (RAM) 520, a power supply 540 and a memory system (10 or 20), all operatively connected to bus system 550. The functionality of the CPU 510, user interface 530, RAM 520, power supply 540 and bus system 550 are well understood by those skilled in the art. The memory system may, for example, correspond to the memory system 10 shown in FIG. 10 or the memory system 20 shown in FIG. 12. In either case, the memory system (10 or 20) includes nonvolatile MLC memory cells for storing N bits of data per memory cell, where N is an integer of 2 or more. Further, the nonvolatile memory device of the memory system (10 or 20) is configured to execute an erase programming after (N−1) page programming in accordance with one or more embodiments described herein.

An MLC flash memory in accordance with one or more of the inventive concepts may be housed on or within any of a variety of different package types. For example, a flash memory device in accordance with one or more of the inventive concepts may be housed on or within a Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concepts have been particularly shown and described with reference to exemplary embodiments thereof, it will be understood that various changes in form and details may be made therein without departing from the spirit and scope of the following claims.

What is claimed is:

1. A method of programming a non-volatile memory including N-bit multi-level cell (MLC) memory cells, said method comprising:
   executing an incremental step pulse programming (ISPP) operation on the MLC memory cells, wherein the ISPP operation includes a programming sequence of first through $N^{th}$ page programming operations, where N is an integer of 2 or more,
   wherein the programming sequence further includes an erase programming that is executed after the $(N-1)^{th}$ page programming operation and before the $N^{th}$ page programming operation, wherein the erase programming increases a threshold voltage distribution of erase cells among the MLC memory cells.

2. The method of claim 1, wherein N-bit MLC memory cells are connected to a plurality of word lines, and wherein the MLC memory cells connected to each word line are for storing N pages of data.

3. The method of claim 1, where N is an integer of 3 or more.

4. The method of claim 3, wherein an $n^{th}$ page programming of each word line is executed after an $(n-1)^{th}$ page programming of a neighboring word line, where n is 1 to N.

5. The method of claim 3, wherein the N page programming operations include a least significant bit (LSB) page programming, at least one center significant bit (CSB) page programming, and a most significant bit (MSB) page programming.

6. The method of claim 5, wherein the erase programming is executed before the MSB page programming and after the at least one CSB page programming.

7. The method of claim 5, wherein the plurality of word lines includes an $(m-1)^{th}$ word line, an $m^{th}$ word line adjacent the $(m-1)^{th}$ word line, and an $(m+1)^{th}$ word line adjacent the $m^{th}$ word line, where m is an integer, and wherein an order of the programming sequence comprises:
   LSB page programming of the $(m-1)^{th}$ word line;
   LSB page programming of the $m^{th}$ word line;
   CSB page programming of the $(m-1)^{th}$ word line;
   LSB page programming of the $(m+1)^{th}$ word line;
   CSB page programming of the $m^{th}$ word line;
   MSB page programming of the $(m-1)^{th}$ word line;
   CSB page programming of the $(m+1)^{th}$ word line;
   MSB page programming of the $m^{th}$ word line;
   MSB page programming of the $(m+1)^{th}$ word line.

8. The method of claim 7, wherein the programming sequence further comprises:
   erase programming of the $(m-1)^{th}$ word line between the CSB and MSB page programming of the $(m-1)^{th}$ word line;
   erase programming of the $m^{th}$ word line between the CSB and MSB page programming of the $m^{th}$ word line;
   erase programming of the $(m+1)^{th}$ word line between the CSB and MSB page programming of the $(m+1)^{th}$ word line.

9. The method of claim 1, wherein the MLC memory cells are flash memory cells programmable by Fowler-Nordheim tunneling.

10. A non-volatile memory, comprising:
    an array of multi-level cell (MLC) memory cells;
    a write circuit configured to execute an incremental step pulse programming (ISPP) operation on the MLC memory cells, wherein the ISPP operation includes a programming sequence of least significant bit (LSB) page programming, at least one center significant bit (CSB) page programming, and a most-significant bit (MSB) page programming;
    wherein the programming sequence executed by the write circuit further includes an erase programming that is executed after the at least one CSB page programming and before the MSB page programming, wherein the erase programming increases a threshold voltage distribution of erase cells among the MLC memory cells.

11. The nonvolatile memory of claim 10, wherein N-bit MLC memory cells are connected to a plurality of word lines, and wherein the MLC memory cells connected to each word line are for storing N pages of data.

12. The nonvolatile memory of claim 10, further comprising a control logic comprising:
    a normal programming unit configured to control the write circuit to execute the LSB page programming, the at least one CSB page programming, and the MSB page programming;
    an erase programming unit configured to control the write circuit to execute the erase programming; and
    a program control unit configured to control the normal programming unit and the erase programming unit.

13. The nonvolatile memory of claim 12, further comprising an address decoder configured to decode addresses received from an external device, and a read circuit configured to read data from the array of MLC memory cells.

14. The nonvolatile memory of claim 10, wherein the MLC memory cells are flash memory cells programmable by Fowler-Nordheim tunneling.

15. A memory system, comprising:
    a non-volatile memory device including an array of multi-level cell (MLC) memory cells connected to a plurality of word lines and bit lines;
    a memory controller including a host interface and operatively connected to the non-volatile memory device;
    wherein the non-volatile memory device includes a write circuit configured to execute an incremental step pulse programming (ISPP) operation on the MLC memory cells connected to each word line, wherein the ISPP operation includes a programming sequence of least significant bit (LSB) page programming, at least one center significant bit (CSB) page programming, and most-significant bit (MSB) page programming;
    wherein the programming sequence executed by the write circuit further includes an erase programming that is executed after the at least one CSB page programming and before the MSB page programming, wherein the erase programming increases a threshold voltage distribution of erase cells among the MLC memory cells.

16. The memory system of claim 15, wherein the memory system is at least one of a multimedia card (MMC) card, a Secure Digital (SD) card, a micro SD card, a memory stick, an ID card, a PCMCIA card, a chip card, a USB card, a smart card, and a Compact Flash (CF) card.

17. The memory system of claim 15, wherein the host interface is at least one of a universal serial bus (USB), a multimedia card (MMC) interface, a peripheral component interconnect-express (PCI-E), a serial advanced technology attachment (SATA), a parallel advanced technology attachment (PATA), a small computer system interface (SCSI), an enhanced small disk interface (ESDI), integrated drive electronics (IDE).

18. The memory system of claim 15, wherein N-bit MLC memory cells are connected to a plurality of word lines, and wherein the MLC memory cells connected to each word line are for storing N pages of data.

19. The memory system of claim 15, wherein the nonvolatile memory further comprising a control logic comprising:
    a normal programming unit configured to control the write circuit to execute the LSB page programming, the at least one CSB page programming, and the MSB page programming;
    an erase programming unit configured to control the write circuit to execute the erase programming; and
    a program control unit configured to control the normal programming unit and the erase programming unit.

20. The memory system of claim 15, wherein the MLC memory cells are flash memory cells programmable by Fowler-Nordheim tunneling.

* * * * *